(12) United States Patent
Zeng

(10) Patent No.: US 12,419,043 B2
(45) Date of Patent: Sep. 16, 2025

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventor: Yizhi Zeng, Hefei (CN)

(73) Assignee: CHANGXIN MEMORY TECHNOLOGIES., INC., Hefei (CN)

( * ) Notice: Subject to any disclaimer, the term of this patent is extended or adjusted under 35 U.S.C. 154(b) by 507 days.

(21) Appl. No.: 17/948,918

(22) Filed: Sep. 20, 2022

(65) Prior Publication Data
US 2023/0017189 A1    Jan. 19, 2023

Related U.S. Application Data

(63) Continuation of application No. PCT/CN2022/105152, filed on Jul. 12, 2022.

(30) Foreign Application Priority Data

Jun. 23, 2022    (CN) .......................... 202210726332.2

(51) Int. Cl.
  H10B 12/00    (2023.01)
(52) U.S. Cl.
  CPC ............. H10B 12/50 (2023.02); H10B 12/09 (2023.02)
(58) Field of Classification Search
  CPC ... H10B 12/50; H10B 12/09; H01L 21/76224; H01L 21/76229; H01L 21/76232; H10D 62/115
  See application file for complete search history.

(56) References Cited

U.S. PATENT DOCUMENTS

| 8,198,171 | B2 | 6/2012 | Kim |
| 8,384,188 | B2 | 2/2013 | Kim |
| 8,399,363 | B1 * | 3/2013 | Lee ................... H01L 21/02164 |
| | | | 438/763 |
| 8,697,579 | B2 | 4/2014 | Park |

(Continued)

FOREIGN PATENT DOCUMENTS

| CN | 102054740 A | 5/2011 |
| CN | 108231774 A | 6/2018 |

(Continued)

OTHER PUBLICATIONS

First Office Action of the Taiwanese application No. 111138639, issued on Jul. 27, 2023, 7 pages with English abstract.

(Continued)

*Primary Examiner* — Yasser A Abdelaziz
(74) *Attorney, Agent, or Firm* — SYNCODA LLC; Feng Ma

(57) ABSTRACT

Embodiments of the disclosure provide a semiconductor structure and a method for manufacturing the same. The semiconductor structure includes a substrate, a first isolation trench located in the substrate, a first insulating layer covering a bottom surface and a lower part of a sidewall of the first isolation trench, a second insulating layer covering an upper part of the sidewall of the first isolation trench, and a third insulating layer at least partially located between the first insulating layer and the second insulating layer to isolate the first insulating layer from the second insulating layer.

12 Claims, 12 Drawing Sheets

(56) References Cited

U.S. PATENT DOCUMENTS

| | | |
|---|---|---|
| 10,832,983 B2 | 11/2020 | Choi |
| 11,201,156 B2 | 12/2021 | Yoon |
| 11,424,249 B2 | 8/2022 | Chun |
| 2005/0095788 A1 | 5/2005 | O'Riain et al. |
| 2008/0280441 A1* | 11/2008 | Lee .................. H01L 21/76232 438/692 |
| 2009/0267199 A1 | 10/2009 | Kim et al. |
| 2010/0072534 A1* | 3/2010 | Nagano .................. H10B 41/35 257/E21.422 |
| 2010/0087043 A1* | 4/2010 | Cheng ................ H10D 84/0151 257/E21.546 |
| 2010/0151656 A1* | 6/2010 | Kim .................. H01L 21/76232 257/E21.546 |
| 2011/0101488 A1* | 5/2011 | Kim .................. H01L 21/76229 257/E21.546 |
| 2012/0223408 A1 | 9/2012 | Kim |
| 2018/0166352 A1 | 6/2018 | Choi et al. |
| 2020/0075730 A1 | 3/2020 | Lee et al. |
| 2022/0052055 A1 | 2/2022 | Chun |
| 2022/0344349 A1 | 10/2022 | Chun |

FOREIGN PATENT DOCUMENTS

| | | |
|---|---|---|
| CN | 114078958 A | 2/2022 |
| JP | 2011097015 A | 5/2011 |
| KR | 20070071102 A | 7/2007 |
| KR | 20080114065 A | 12/2008 |
| KR | 20100011557 A | 2/2010 |
| TW | 202224188 A | 6/2022 |

OTHER PUBLICATIONS

International Search Report in the international application No. PCT/CN2022/105152, mailed on Mar. 15, 2023.
KR first office action in application No. 10-2022-7031206, mailed on Nov. 1, 2024.
Supplementary European search report in application No. 22769874.3, mailed on Feb. 17, 2025.

\* cited by examiner

SEMICONDUCTOR STRUCTURE AND METHOD FOR MANUFACTURING SAME

CROSS-REFERENCE TO RELATED APPLICATION

The disclosure is a U.S. continuation application of International Application No. PCT/CN2022/105152 filed on Jul. 12, 2022, which based upon and claims priority to Chinese Patent Application No. 202210726332.2 filed on Jun. 23, 2022. The disclosures of these applications are hereby incorporated by reference in their entirety.

TECHNICAL FIELD

The disclosure relates to the technical field of semiconductor manufacturing, in particular to a semiconductor structure and a method for manufacturing the same.

BACKGROUND

A semiconductor structure generally includes a substrate, multiple transistors located on the substrate, and an isolation structure located in the substrate for isolating the multiple transistors. The transistors usually adopt a planar gate structure, and the gate structure thereof is intersected with the isolation structure.

However, with the continuous development of semiconductor structures towards miniaturization and high integration, the electric field between transistor channel regions increases rapidly, thereby generating many hot electrons, leading to Hot Electron Induced Punch-through (HEIP) effect. Hot electrons may be trapped in the isolation structures, which deteriorates the turn-off characteristics of the transistor and degrades the performance of the semiconductor structure.

SUMMARY

Embodiments of the disclosure provide a semiconductor structure. The semiconductor structure includes a substrate, a first isolation trench located in the substrate, a first insulating layer covering a bottom surface and a lower part of a sidewall of the first isolation trench, a second insulating layer covering an upper part of the sidewall of the first isolation trench, and a third insulating layer at least partially located between the first insulating layer and the second insulating layer to isolate the first insulating layer from the second insulating layer.

The embodiments of the disclosure also provide a method for manufacturing a semiconductor structure. The method includes the following operations.

A substrate is provided.

The substrate is etched to form a first isolation trench.

A first insulating layer is formed and covers a bottom surface and a lower part of a sidewall of the first isolation trench.

A third insulating layer is formed on the first insulating layer, and at least covers a top of the first insulating layer.

A second insulating layer is formed on the third insulating layer, covers an upper part of the sidewall of the first insulating trench, and is isolated from the first insulating layer by the third insulating layer.

Details of one or more embodiments of the present disclosure are set forth in the following accompany drawings and description. Other features and advantages of the present disclosure will become apparent from the accompany drawings of the specification and the claims.

BRIEF DESCRIPTION OF THE DRAWINGS

To more clearly illustrate technical solution in the embodiments of the disclosure, the drawings needed in the embodiments will be briefly described below, and it will be apparent that the drawings described below are only of some embodiments of the disclosure, from which other drawings may be obtained without creative effort by a person of ordinary skill in the art.

DETAILED DESCRIPTION

Figure 1:
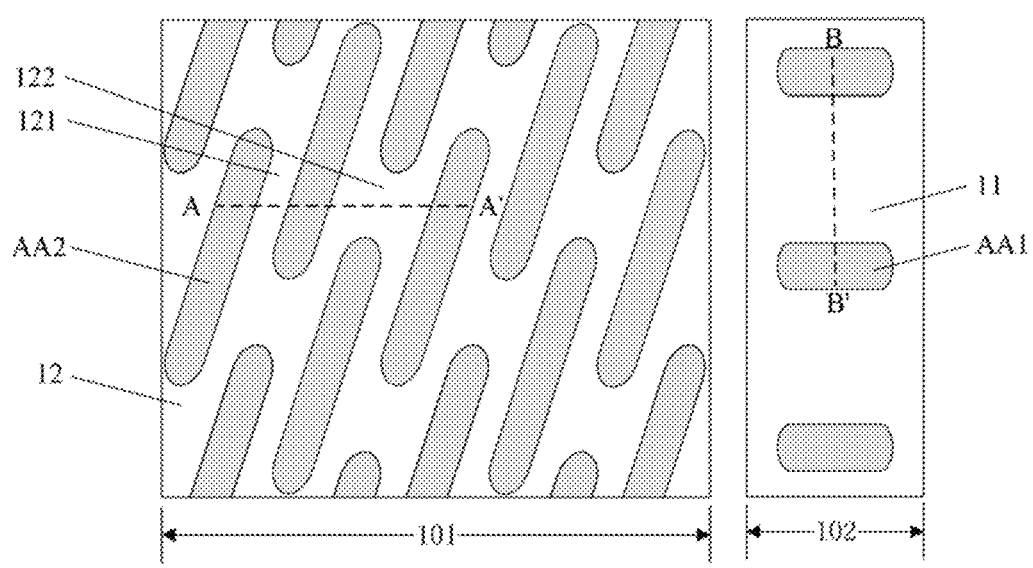
FIG. 1 schematically shows a top view of a semiconductor structure provided by an embodiment of the disclosure.

Exemplary embodiments of the disclosure will be described in more detail below with reference to the accompanying drawings. Although the exemplary embodiments of the disclosure are shown in the accompanying drawings, it is to be understood that the disclosure may be implemented in various forms and should not be limited by the specific embodiments set forth herein. On the contrary, these embodiments are provided to enable a more thorough understanding of the disclosure and to fully convey the scope of the disclosure to those skilled in the art.

In the following description, numerous specific details are given to provide a more thorough understanding of the disclosure. However, it will be apparent to those skilled in the art that the disclosure may be practiced without one or more of these details. In other examples, some technical features well known in the art are not described in order to avoid confusion with the disclosure. That is, not all features of the actual embodiments are described herein, and well-known functions and structures are not described in detail.

In the figures, the sizes of a layer, an area, and an element and their relative sizes may be exaggerated for clarity. The same reference sign represents the same element throughout.

It should be understood that while the element or the layer is referred to as being "on", "adjacent to", "connected to" or "coupled to" other elements or layers, it may be directly on the other elements or layers, adjacent to, connected or coupled to the other elements or layers, or an intermediate element or layer may be existent. In contrast, while the element is referred to as being "directly on", "directly adjacent to", "directly connected to" or "directly coupled to" other elements or layers, the intermediate element or layer is not existent. It should be understood that although terms "first", "second", "third" and the like may be used to describe various elements, components, areas, layers and/or sections, these elements, components, areas, layers and/or sections should not be limited by these terms. These terms are only used to distinguish one element, component, area, layer or section from another element, component, area, layer or section. Therefore, without departing from the teaching of the disclosure, a first element, component, area, layer, or section discussed below may be represented as a second element, component, area, layer, or section. While the second element, component, area, layer, or section is discussed, it does not mean that the first element, component, area, layer, or section is necessarily existent in the disclosure.

Spatial relation terms, such as "under . . . ", "below . . . ", "lower", "underneath . . . ", "above . . . ", "upper" and the like, may be used here for conveniently describing a relationship between one element or feature shown in the drawings and other elements or features. It should be understood that in addition to orientations shown in the drawings, the spatial relation terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below . . . " and "under . . . " may include two orientations of up and down. The device may be otherwise oriented (rotated by 90 degrees or other orientations) and the spatial relation terms used here are interpreted accordingly.

The terms used here are only intended to describe the specific embodiments and are not limitations to the disclosure. As used herein, singular forms of "a", "an" and "said/the" are also intended to include plural forms, unless otherwise clearly indicated in the context. It should also be understood that terms "composing" and/or "including", while used in the description, demonstrate the presence of the described features, integers, steps, operations, elements and/or components, but do not exclude the presence or addition of one or more other features, integers, steps, operations, elements, components, and/or groups. As used herein, a term "and/or" includes any and all combinations of related items listed.

A semiconductor structure generally includes a substrate, multiple transistors located on the substrate, and an isolation trench located in the substrate for isolating the multiple transistors, and an isolation structure located within the isolation trench. The transistors usually have a planar gate structure, and the gate structure thereof is intersected with the isolation structure. The isolation structure typically includes an oxide layer covering an inner wall of the isolation trench, a nitride layer covering the oxide layer, and a filling layer filling the isolation trench.

However, with the continuous development of semiconductor structures towards miniaturization and high integration, the electric field between transistor channel regions increases rapidly, thereby generating many hot electrons. Hot electrons may be trapped in the nitride layer which has an ability of trapping high-energy electrons, and the trapped hot electrons may attract holes, and thus the holes are concentrated in the substrate adjacent to the isolation structures, which makes the effective channel length of the transistor smaller than an original length thereof. Therefore, a current may flow even without a voltage applied to the gate structure of the transistor, which deteriorates the turn-off characteristics of the transistor, increases the leakage current of the transistor, and degrades the performance of the semiconductor structure. This is the Hot Electron Induced Punch-through (HEIP) effect.

HEIP effect is usually alleviated by increasing the thickness of the oxide layer to increase the distance between the nitride layer and the substrate. However, this increases process difficulty of forming the isolation structure.

Based on this, the following technical solutions are provided in the embodiments of the present disclosure. The specific embodiments of the present disclosure will be described in detail below in conjunction with the accompany drawings. In detailing the embodiment of the disclosure, for the sake of illustration, scheme diagrams will not be partially enlarged in accordance with the normal scale. The scheme diagrams are only exemplary, and should not limit the scope of protection of the disclosure here.

Figure 2:
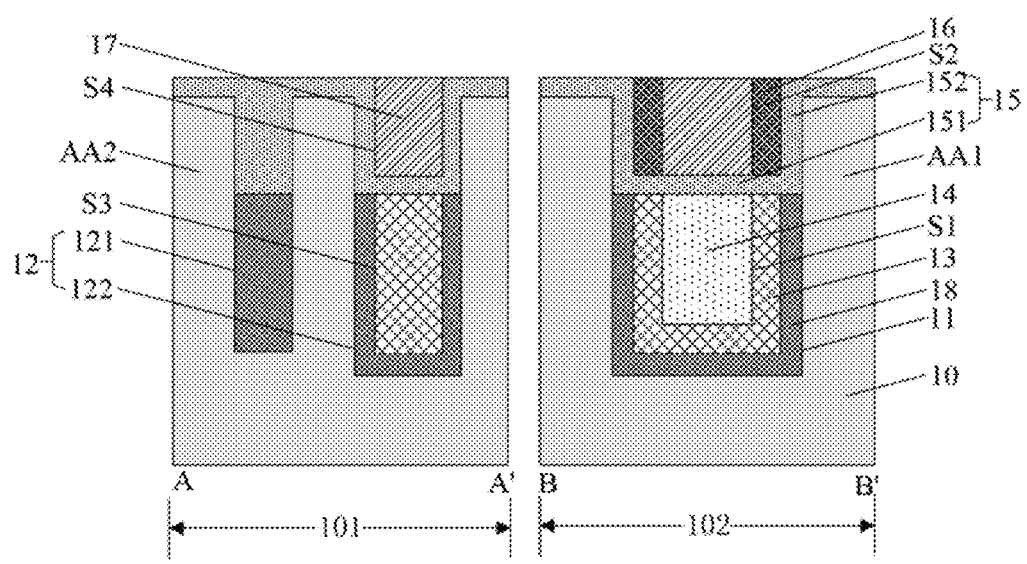
FIG. 2 schematically shows a cross-sectional diagram of a structure along the lines A-A', B-B' of FIG. 1.

FIG. 1 schematically shows a top view of a semiconductor structure provided by an embodiment of the disclosure. FIG. 2 schematically shows a cross-sectional diagram of a structure along the lines A-A', B-B' of FIG. 1. The semiconductor structure provided by the embodiments of the disclosure will be described further below with reference to the accompanying FIG. 1 to FIG. 2.

As shown in the figures, the semiconductor structure includes a substrate 10, a first isolation trench 11 located in the substrate 10, a first insulating layer 13 covering a bottom surface and a lower part of a sidewall of the first isolation trench 11, a second insulating layer 16 covering an upper part of the sidewall of the first isolation trench 11, and a third insulating layer 15 at least partially located between the first insulating layer 13 and the second insulating layer 16 to isolate the first insulating layer 13 and the second insulating layer 16.

In practices, the semiconductor structure provided by the embodiments of the present disclosure may be a three-dimensional dynamic random access memory (3D DRAM), but is not limited thereto. The semiconductor structure may also be any semiconductor structure.

The substrate may be a semiconductor substrate and may include at least one elemental semiconductor material, such as silicon (Si) substrate, germanium (Ge) substrate), at least one III-V compound semiconductor material, at least one II-VI compound semiconductor material, at least one organic semiconductor material, or other semiconductor materials known in the art. In a particular embodiment, a semiconductor substrate is a silicon substrate, which may or may not be doped.

In an embodiment, the substrate 10 includes a device unit region 101, and a device core region or a peripheral region 102. In some embodiments, the first isolation trench 11 is located in a device core region or a peripheral region 102 for isolating selection transistors. Specifically, the first isolation trench 11 defines at least one first active area AA1 in the device core region or peripheral region 102. In practice, a selection transistor having a planar gate structure, such as a P-type transistor or an N-type transistor may be formed on the first active area AA1.

In an embodiment, materials of the first insulating layer 13 and the second insulating layer 16 include nitride. In the embodiments of the present disclosure, nitride is used as the materials of the first insulating layer 13 and the second insulating layer 16. By doing so, tensile stress, or compressive stress of channel regions of the transistors can be increased according to requirements, thereby satisfying the requirements on stress of the transistors and improving mobility of carriers in the channel regions of the transistors. Specifically, the tensile stress causes tensile strain in the channel regions, which can increase the mobility of electrons in the N-type transistors, while the compressive stress causes compressive strain in the channel regions, which can increase the mobility of holes in the P-type transistors. The material of the first insulating layer 13 may be the same as or be different from that of the second insulating layer 16. In an embodiment, the material of the first insulating layer 13 is the same as that of the second insulating layer 16 for example, being silicon nitride. But it is not limited to the above, any material satisfying the stress requirements described above may be used as the materials of the first insulating layer 13 and the second insulating layer 16. The material of the third insulating layer 15 includes oxide, for example, silicon oxide.

The first insulating layer 13 and the second insulating layer 16 have an ability to capture hot electrons. In the embodiments of the present disclosure, the third insulating layer 15 is used to isolate the first insulating layer 13 from the second insulating layer 16, thereby isolating hot electrons trapped in the first insulating layer 13 from hot electrons trapped in the second insulating layer 16, preventing the hot electrons trapped in the second insulating layer 16 from flowing to the first insulating layer 13, and thus reducing the number of the hot electrons stored in the first insulating layer 13. Meanwhile, the first insulating layer 13 and the second insulating layer 16 are isolated from each other. Compared with the case where the first insulating layer 13 and the second insulating layer 16 are not isolated from each other, carriers for storing hot electrons are reduced in the first insulating layer 13 and the second insulating layer 16, so that they only can store relatively few hot electrons, which can effectively alleviate the HEIP effect.

A ratio of a height of the first insulating layer 13 to a height of the second insulating layer 16 should not be too large or too small. When the ratio of the height of the first insulating layer 13 to the height of the second insulating layer 16 is too large, the first insulating layer 13 will extend to the upper part of the first isolation trench 11, and thus more hot electrons will be stored in the first insulating layer 13, and more holes will be accumulated in the upper part of the first active area AA1, which cannot effectively alleviate the HEIP effect. If the ratio of the height of the first insulating layer 13 to the height of the second insulating layer 16 is too small, the height of the second insulating layer 16 located in the upper part of the first isolation trench 11 will be high, the second insulating layer 16 will capture a larger number of hot electrons, and thus more holes will be accumulated the upper part of the first active area AA1, which cannot effectively alleviate the HEIP effect, either. In an embodiment, the ratio of the height of the first insulating layer 13 to the height of the second insulating layer 16 is in a range of 2 to 6, specifically, for example, 3, 4, 5, etc.

A height of a part of the third insulating layer 15 located between the first insulating layer 13 and the second insulating layer 16 should not be too large or too small. When the height of the part of the third insulating layer 15 located between the first insulating layer 13 and the second insulating layer 16 is too large, a sum of the height of the first insulating layer 13 and the height of the second insulating layer 16 will be too small, which results in that the first insulating layer 13 and the second insulating layer 16 cannot effectively raise the stress of the substrate 10. When the height of the part of the third insulating layer 15 located between the first insulating layer 13 and the second insulating layer 16 is too small, the HEIP effect cannot be effectively alleviated. In an embodiment, a ratio of the height of the part of the third insulating layer 15 located between the first insulating layer 13 and the second insulating layer 16 to the height of the second insulating layer 16 is in a range of 0.3 to 0.7, specifically, for example, 0.4, 0.5, 0.6, etc.

In an embodiment, both a thickness of the first insulating layer 13 and a thickness of the second insulating layer 16 are in a range of 5 nm to 30 nm. In some embodiments, both the thickness of the first insulating layer 13 and the thickness of the second insulating layer 16 are in range of 10 nm to 25 nm. In a specific embodiment, the thickness of the first insulating layer 13 is greater than that of the second insulating layer 16, and the second insulating layer 16 has a thinner thickness. Therefore, hot electrons stored in the second insulating layer 16 are relatively few, thereby effectively alleviating the HEIP effect.

In an embodiment, the semiconductor structure further includes: a fourth insulating layer 18 and a first filling layer 14. The fourth insulating layer 18 is located between the inner wall of the first isolation trench 11 and the first insulating layer 13, covers the bottom surface and the lower part of the sidewall of the first isolation trench 11. The first filling layer 14 fills a recess S1 defined by the first insulating layer 13 in the first isolation trench 11. A material of the fourth insulating layer 18 may be the same as that of the third insulating layer 15, for example, silicon oxide. A material of the first filling layers 14 may be an oxide, such as silicon oxide.

In an embodiment, the third insulating layer 15 includes a bottom layer 151 and a sidewall layer 152. The bottom layer 151 overs tops of the fourth insulating layer 18, the first insulating layer 13, and the first filling layer 14. The sidewall layer 152 is located between the upper part of the sidewall of the first isolation trench 11 and the second insulating layer 16. In some embodiments, the third insulating layer 15 also covers the upper surface of the substrate 10.

In the embodiment of the present disclosure, by disposing the fourth insulating layer 18 between the substrate 10 and the first insulating layer 13, and disposing the third insulating layer 15 between the substrate 10 and the second insulating layer 16, the substrate 10 is isolated from the first insulating layer 13 and the second insulating layer 16, thereby further alleviating the HEIP effect. In addition, in the embodiment of the present disclosure, by using the third insulating layer 15 to isolate the first insulating layer 13 from the second insulating layer 16, the HEIP effect is effectively alleviated. Therefore, there is no need to additionally thicken the thicknesses of the fourth insulating layer 18 and the third insulating layer 15, which simplifies the process and increases processing windows.

In an embodiment, the semiconductor structure further includes a second filling layer 17. The second filling layer 17 fills a recess S2 defined by the second insulating layer 16 together with the bottom layer 151 of the third insulating layer 15 in the first isolation trench 11. A material of the second filling layer 17 may be the same as that of the first filling layer 14, for example, silicon oxide.

In an embodiment, the semiconductor structure further includes a second isolation trench 12. The second isolation trench 12 includes a first sub-trench 121 and a second sub-trench 122. A width of the second sub-trench 122 is greater than a width of the first sub-trench 121. Specifically, second isolation trenches 12 are located in the device unit region 101 for isolating memory units, and define multiple second active areas AA2 arranged in parallel with each other in the device unit region 101. In practice, the first isolation trench 11 and the second isolation trench 12 are formed in the same processing operation, and the width of the first isolation trench 11 is greater than that of the first sub-trench 121 and that of the second sub-trenches 122. It is to be understood that, since both the width of the first isolation trenches 11 and that of the second sub-trenches 122 are greater than the width of the first sub-trenches 121, depths of the first isolation trench 11 and the second sub-trench 122 are greater than a depth of the first sub-trench 121 under the same etching conditions.

In an embodiment, the fourth insulating layer 18 covers a bottom surface and a lower part of a sidewall of the second sub-trench 122. The first insulating layer 13 fills a recess S3 defined by the fourth insulating layer 18 in the second sub-trench 122. The third insulating layer 15 covers an upper part of a sidewall of the second sub-trench 122 and the tops of the fourth insulating layer 18 and the first insulating layer 13. The second filling layer 17 fills a recess S4 defined by the third insulating layer 15 in the second sub-trench 122. In some embodiments, the fourth insulating layer 18 fills a lower part of the first sub-trench 121, and the third insulating layer 15 fills an upper part of the first sub-trench 121.

Figure 3:
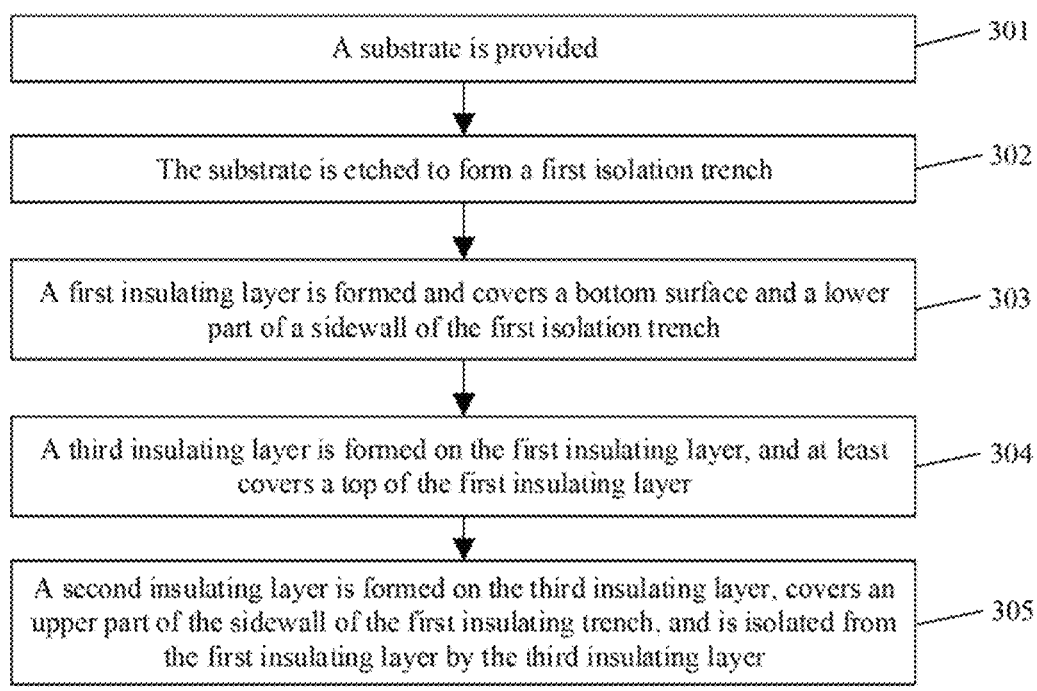
FIG. 3 is a flowchart of a method for manufacturing a semiconductor structure provided by an embodiment of the disclosure.

The embodiments of the disclosure also provide a method for manufacturing a semiconductor structure, as shown in FIG. 3. The method includes the following operations.

At step S301, a substrate is provided.

At step S302, the substrate is etched to form a first isolation trench.

At step S303, a first insulating layer is formed, and covers a bottom surface and a lower part of a sidewall of the first isolation trench.

At step S304, a third insulating layer is formed on the first insulating layer, at least covers a top of the first insulating layer.

At step S305, a second insulating layer is formed on the third insulating layer, covers an upper part of the sidewall of the first insulating trench, and is isolated from the first insulating layer by the third insulating layer.

The method for manufacturing the semiconductor structure of the embodiments of the present disclosure is further described in detail below with reference to FIG. 4 to FIG. 12 and FIG. 2. FIGS. 4 to 12 schematically show cross-sectional structures along lines A-A 'and B-B' of FIG. 1 during each processing operation.

Figure 4:
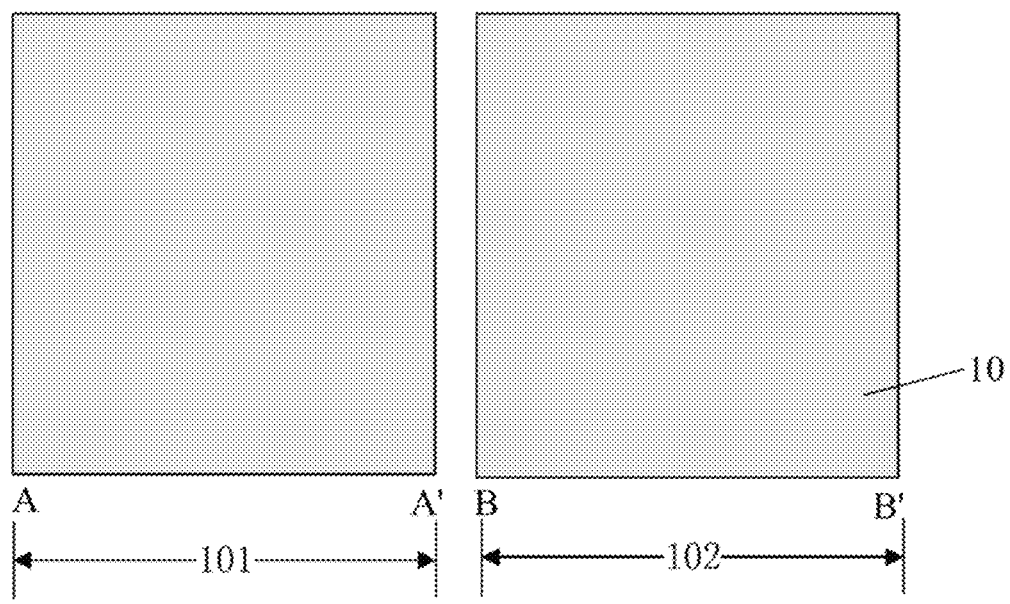
FIGS. 4 to 12 schematically show structures of a semiconductor structure during a manufacturing process provided by an embodiment of the disclosure.

First, as shown in FIG. 4, step S301 is performed and a substrate is provided.

The substrate may be a semiconductor substrate and may include at least one elemental semiconductor material (such as silicon (Si) substrate, germanium (Ge) substrate), at least one III-V compound semiconductor material, at least one II-VI compound semiconductor material, at least one organic semiconductor material, or other semiconductor materials known in the art. In a particular embodiment, a semiconductor substrate is a silicon substrate, which may or may not be doped.

In an embodiment, the substrate 10 includes a device unit region 101, and a device core region or a peripheral region 102. In practice, memory units may be formed in the device unit region 101 and selection transistors may be formed in the device core region or peripheral region 102.

Figure 5:
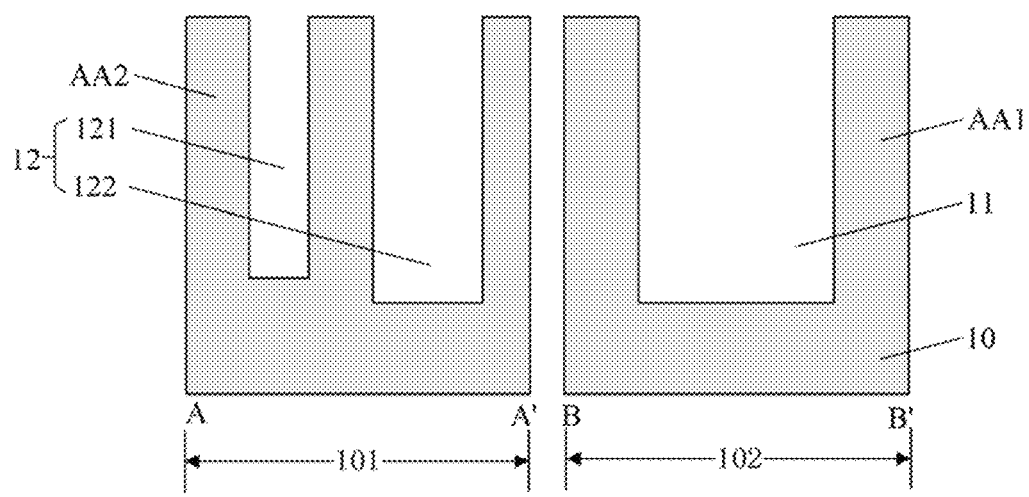

Next, step S302 is performed, as shown in FIG. 5, the substrate 10 is etched to form the first isolation trench 11.

Specifically, the first isolation trench 11 may be formed by photolithography and dry/wet etching processes. The first isolation trench 11 is formed in the device core or peripheral region 102, and defines at least one first active area AA1 in the device core region or peripheral region 102. In practice, a selection transistor having a planar gate structure, such as a P-type transistor or an N-type transistor may be formed in the first active area AA1.

In an embodiment, in the same step of etching the substrate 10 to form the first isolation trench 11, the method further includes the following operations. The substrate 10 is etched to form to form a second isolation trench 12. The second isolation trench 12 includes a first sub-trench 121 and a second sub-trench 122. A width of the second sub-trench 122 is greater than a width of the first sub-trench 121. In some embodiments, second isolation trenches 12 are formed in the device unit region 101 for isolating memory units, and define multiple second active areas AA2 arranged in parallel with each other in the device unit region 101. In practice, the memory units may subsequently be formed in the second active areas AA2 and the second isolation trenches 12 are used to isolate the memory units. In the embodiment of the present disclosure, the first isolation trenches 11 and the second isolation trenches 12 are formed in the same processing operation, thereby omitting one masking process, and thus simplifying the process.

In an embodiment, the width of the first isolation trenches 11 is greater than that of the first sub-trench 121 and that of the second sub-trench 122. It is to be understood that, since both the width of the first isolation trench 11 and that of the second sub-trench 122 are greater than the width of the first sub-trench 121, depths of the first isolation trench 11 and the second sub-trench 122 are greater than a depth of the first sub-trench 121 under the same etching conditions.

Figure 7:
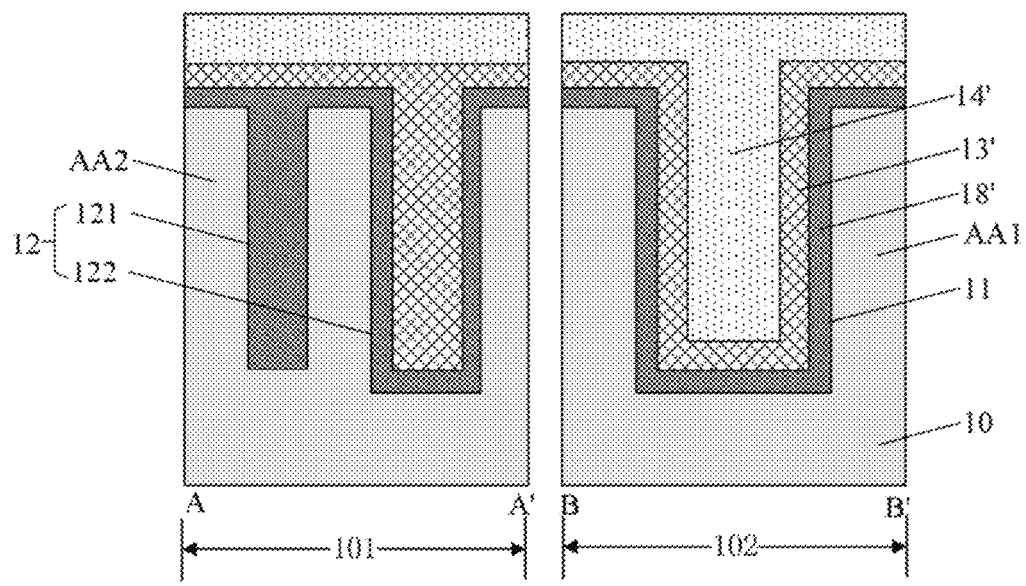
Figure 8:
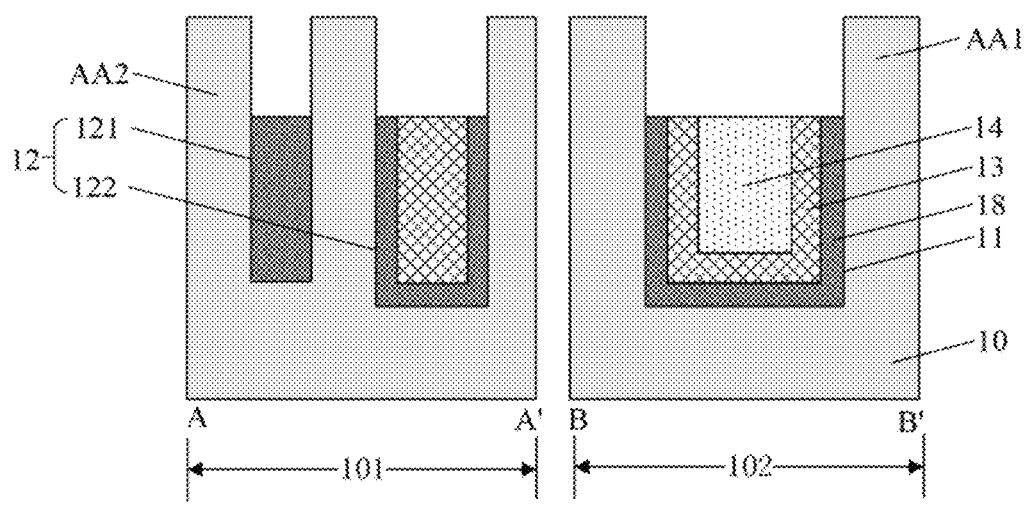

Next, step S303 is performed, and as shown in FIGS. 7 to 8, a first insulating layer 13 is formed. The first insulating layer 13 covers a bottom surface and a lower part of the sidewall of the first isolation trench 11.

Figure 6:
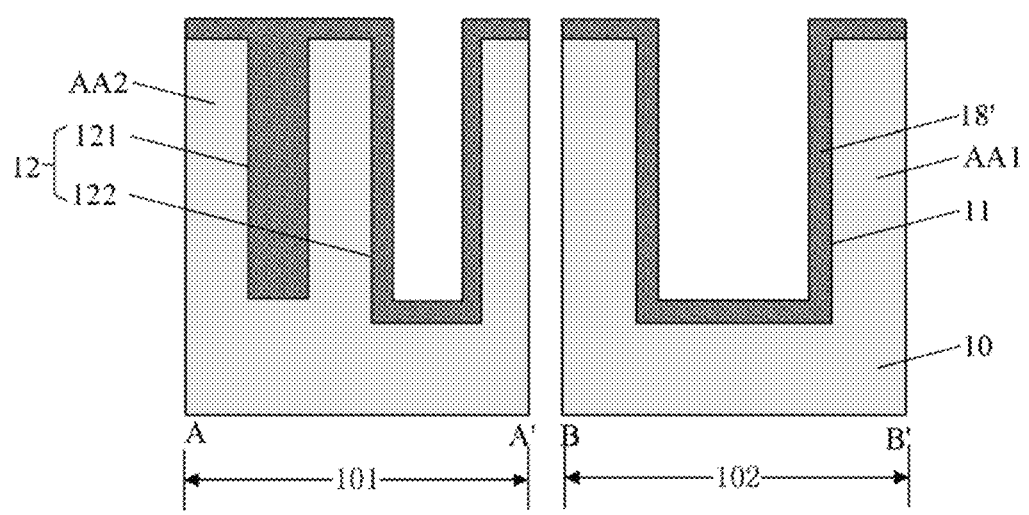

In an embodiment, as shown in FIG. 6, before forming the first insulating layer 13, a fourth insulating material layer 18' is formed. The fourth insulating material layer 18' covers inner surfaces of the first isolation trench 11 and the second sub-trench 122, and fills the first sub-trench 121. In some embodiments, the fourth insulating material layer 18' also covers the upper surface of the substrate 10. It is to be understood that, since the depth and the width of the first sub-trench 121 are relative small, the fourth insulating material layer 18' can fully fill the first sub-trench 121, but cannot fully fill the first isolation trench 11 and the second sub-trench 122 under the same deposition conditions. Therefore, the fourth insulating layer 18 finally formed fills a lower part of the first sub-trench 121. The fourth insulating material layer 18' may be formed by using an atomic layer deposition (ALD) process combined with an in-situ steam generation process (ISSG). A material of the fourth insulating layer 18 includes oxide, for example, silicon oxide.

Referring to FIGS. 7 to 8 again, the forming the first insulating layer 13 includes the following operations.

A first insulating material layer 13' is formed, covers the fourth insulating material layer 18', and fully fills the second sub-trench 122.

A first filling material layer 14' is formed, covers the first insulating material layer 13', and fully fills the first isolation trench 11.

The first filling material layer 14', the first insulating material layer 13' and the fourth insulating material layer 18' are etched to make tops of the first insulating material layer 13', the fourth insulating material layer 18' and the first filling material layer 14' lower than the upper surface of the substrate 10, thereby forming the first insulating layer 13, the fourth insulating layer 18 and the first filling layer 14.

It is to be understood that, since the width of the second sub-trench 122 is smaller than that of the first isolation trench 11, the first insulating material layer 13' can fully fill the second sub-trench 122, but cannot fully fill the first isolation trench 11 under the same deposition conditions. The first insulating material layer 13' and the first filling material layer 14' may be formed by using a chemical vapor deposition (CVD) process, a plasma enhanced chemical vapor deposition (PECVD) process, an atomic layer deposition (ALD) process, or a combination thereof. A material of the first insulating layer 13 includes nitride, for example, silicon nitride. A material of the first insulating layer 14 includes oxide, for example, silicon oxide.

Figure 9:
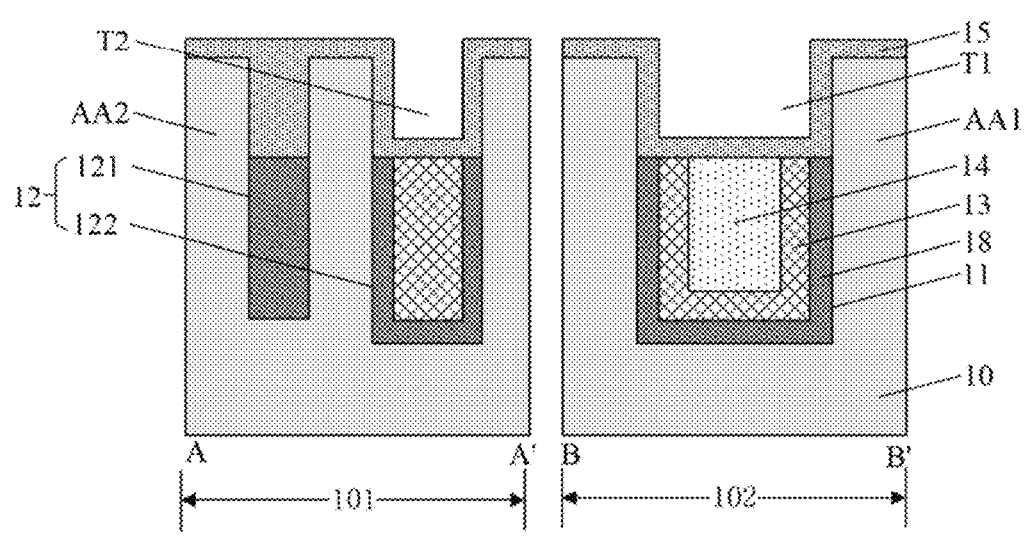

Next, step S304 is performed, and as shown in FIG. 9, a third insulating layer 15 is formed on the first insulating layer 13. The third insulating layer 15 at least covers a top of the first insulating layer 13.

Specifically, the forming the third insulating layer 15 includes the following operations. A third insulating material layer (not shown in the figures) is formed and etched to form the third insulating layer 15 covering tops of the fourth insulating layer 18, the first insulating layer 13 and the first filling layer 14 and upper parts of sidewalls of the first isolation trench 11 and the second sub-trench 122. A part of the third insulating layer 15 within the first isolation trench 11 defines a first accommodating cavity T1, and a part of the third insulating layer 15 within the second sub-trench 122 defines a second accommodating cavity T2. The third insulating layer 15 also covers the upper surface of the substrate 10.

It is to be understood that, the width and depth of the first sub-trench 121 are relative small, so that the third insulating layer 15 can fully fill a part of the first sub-trench 121 that is not filled by the fourth insulating layer 18 under the same deposition conditions. The third insulating layer 15 may be formed by using a chemical vapor deposition (CVD) process, a plasma enhanced chemical vapor deposition (PECVD) process, an atomic layer deposition (ALD) process, or a combination thereof. A material of the third insulating layer 15 includes oxide, for example, silicon oxide.

Figure 10:
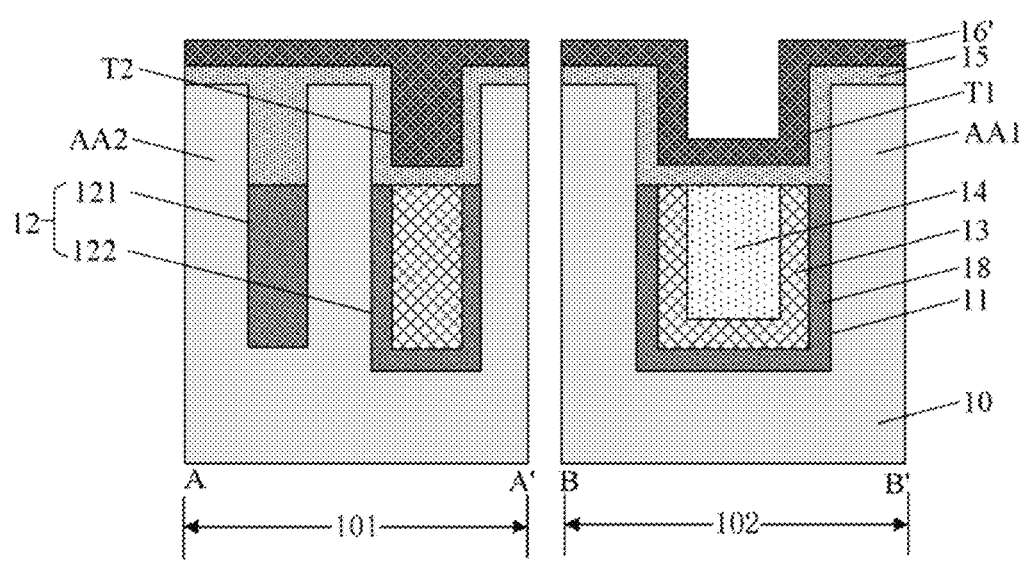
Figure 11:
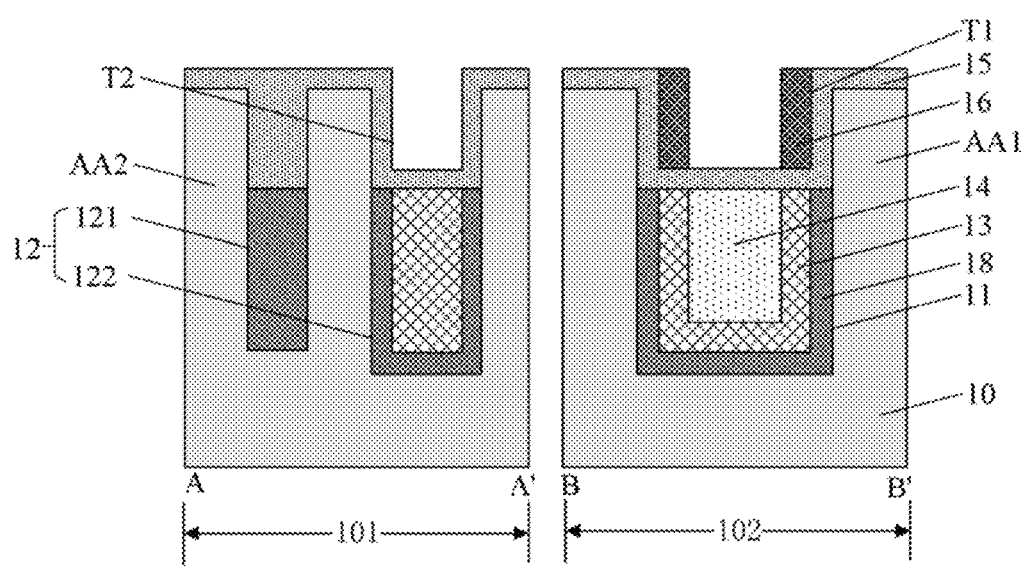

Next, step S305 is preformed, and as shown in FIGS. 10 to 11, a second insulating layer 16 is formed over the third insulating layer 15. The second insulating layer 16 covers the upper part of the sidewall of the first insulating trench 11. The third insulating layer 15 isolates the first insulating layer 13 from the second insulating layer 16.

Specifically, the forming the second insulating layer 16 includes the following operations.

A second insulating material layer 16' is formed, covers a bottom surface and a sidewall of the first accommodating cavity T1, and fully fills the second accommodating cavity T2.

The second insulating material layer 16' is etched to removing the second insulating material layer 16' located in the second accommodating cavity T2 and the second insulating material layer 16' covering the bottom surface of the first accommodating cavity T1 to form the second insulating layer 16 covering the sidewall of the first accommodating cavity T1.

It is to be understood that, since the width of the second sub-trench 122 is smaller than that of the first isolation trench 11, a width of the second accommodating cavity T2 is smaller than that of the first accommodating cavity T1. The second insulating material layer 16' can fully fill the second accommodating cavity T2, but cannot fully fill the first accommodating cavity T1, under the same deposition conditions. The second insulating material layer 16 may be formed by using a chemical vapor deposition (CVD) process, a plasma enhanced chemical vapor deposition (PECVD) process, an atomic layer deposition (ALD) process, or a combination thereof.

In an embodiment, a material of the second insulating layer 16 includes nitride. In the embodiment of the present disclosure, nitride is used as the materials of the first insulating layer 13 and the second insulating layer 16. By doing so, tensile stress or compressive stress of channel regions of the transistors can be increased according to requirements, thereby satisfying the requirements on stress of the transistors and improving mobility of carriers in the channel regions of the transistors. Specifically, the tensile stress causes tensile strain in the channel regions, which can increase the mobility of electrons in the N-type transistors, while the compressive stress causes compressive strain in the channel regions, which can increase the mobility of holes in the P-type transistors. The material of the first insulating layer 13 may be the same as or be different from that of the second insulating layer 16. In one specific embodiment, the material of the first insulating layer 13 is the same as that of the second insulating layer 16 for example, being silicon nitride. But it is not limited to the above, any material satisfying the stress requirements described above may be used as the materials of the first insulating layer 13 and the second insulating layer 16.

The first insulating layer 13 and the second insulating layer 16 have an ability to capture hot electrons. In the embodiments of the present disclosure, the third insulating layer 15 is used to isolate the first insulating layer 13 from the second insulating layer 16, thereby isolating hot electrons trapped in the first insulating layer 13 from hot electrons trapped in the second insulating layer 16. Especially, in a subsequent process such as a thermal processing, the hot electrons in the second insulating layer 16 may be lost, and the presence of the third insulating layer 15 can prevent the hot electrons captured in the second insulating layer 16 from flowing into the first insulating layer 13. By doing so, the number of the hot electrons stored in the first insulating layer 13 can be reduced. Meanwhile, the first insulating layer 13 and the second insulating layer 16 are isolated from each other. Compared with the case where the first insulating layer 13 and the second insulating layer 16 are not isolated from each other, carriers for storing hot electrons are reduced in the first insulating layer 13 and the second insulating layer 16, so that they only can store relatively few hot electrons, which can effectively alleviate the HEIP effect.

A ratio of a height of the first insulating layer 13 to a height of the second insulating layer 16 should not be too large or too small. When the ratio of the height of the first insulating layer 13 to the height of the second insulating layer 16 is too large, the first insulating layer 13 will extend to the upper part of the first isolation trench 11, and thus more hot electrons will be stored in the first insulating layer 13, and more holes will be accumulated in the upper part of the first active area AA1, which cannot effectively alleviate the HEIP effect. If the ratio of the height of the first insulating layer 13 to the height of the second insulating layer 16 is too small, the height of the second insulating layer 16 located in the upper part of the first insulating trench 11 will be high, the second insulating layer 16 will capture a greater number of hot electrons, and thus more holes will be accumulated in the upper part of the first active area AA1, which cannot effectively alleviate the HEIP effect, either. In an embodiment, the ratio of the height of the first insulating layer 13 to the height of the second insulating layer 16 is in a range of 2 to 6, specifically, for example, 3, 4, 5, etc.

A height of a part of the third insulating layer 15 located between the first insulating layer 13 and the second insulating layer 16 should not be too large or too small. When the height of the part of the third insulating layer 15 between the first insulating layer 13 and the second insulating layer 16 is too large, a sum of the height of the first insulating layer 13 and the height of the second insulating layer 16 will be too small, which results in that the first insulating layer 13 and the second insulating layer 16 cannot effectively raise the stress of the substrate 10. When the height of the part of the third insulating layer 15 located between the first insulating layer 13 and the second insulating layer 16 is too small, the HEIP effect cannot be effectively alleviated. In an embodiment, a ratio of the height of the part of the third insulating layer 15 located between the first insulating layer 13 and the second insulating layer 16 to the height of the second insulating layer 16 is in a range of 0.3 to 0.7, specifically, for example, 0.4, 0.5, 0.6, etc.

In an embodiment, both a thickness of the first insulating layer 13 and a thickness of the second insulating layer 16 are in a range of 5 nm to 30 nm. In some embodiments, both the thickness of the first insulating layer 13 and the thickness of the second insulating layer 16 are in a range of 10 nm to 25 nm. In a specific embodiment, the thickness of the first insulating layer 13 is greater than that of the second insulating layer 16, and the second insulating layer 16 has a thinner thickness. Therefore, hot electrons stored in the second insulating layer 16 are relatively few, thereby effectively alleviating the HEIP effect.

Referring again to FIG. 11, it can be seen that the fourth insulating layer 18 and the third insulating layer 15 isolate the substrate 10 from the first insulating layer 13 and the second insulating layer 16, respectively, thereby further alleviating the HEIP effect. In addition, in the embodiment of the present disclosure, by using the third insulating layer 15 to isolate the first insulating layer 13 from the second insulating layer 16, the HEIP effect is effectively alleviated. Therefore, there is no need to additionally thicken the thicknesses of the fourth insulating layer 18 and the third insulating layer 15, which simplifies the process and increases processing windows.

Figure 12:
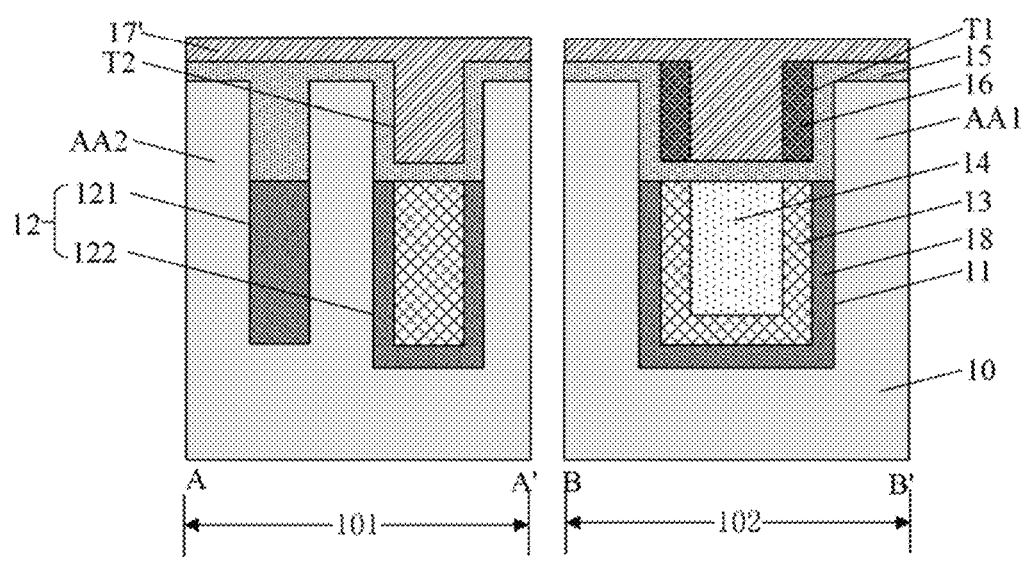

As shown in FIGS. 12 and 2, after forming the second insulating layer 16, the method further includes the following operations.

A second filling material layer 17' is formed on the third insulating layer 15 and the second insulating layer 16. The second filling material layer 17' fully fills the first accommodating cavity T1 and second accommodating cavity T2.

The second filling material layer 17' is etched to make a top of the second filling material layer 17' flush with a top of the second insulating layer 16, thereby forming a second filling layer 17.

The above is only the preferred embodiments of the disclosure, and is not intended to limit the protection scope of the disclosure. Any modification, equivalent replacement and improvement made within the spirit and principles of the disclosure shall be included in the protection scope of the disclosure.

INDUSTRIAL PRACTICALITY

In the embodiments of the present disclosure, the third insulating layer is used to isolate the first insulating layer from the second insulating layer, thereby isolating hot electrons trapped in the first insulating layer from hot electrons trapped in the second insulating layer, preventing the hot electrons trapped in the second insulating layer from flowing to the first insulating layer, and thus reducing the number of the hot electrons stored in the first insulating layer. Meanwhile, the first insulating layer and the second insulating layer are isolated from each other. Compared with the case where the first insulating layer and the second insulating layer are not isolated from each other, carriers for storing hot electrons are reduced in the first insulating layer and the second insulating layer, so that they only can store relatively few hot electrons, which can effectively alleviate the HEIP effect.

What is claimed is:

1. A semiconductor structure comprising:
   a substrate, and a first isolation trench and a second isolation trench located in the substrate;
   a first insulating layer covering a bottom surface and a lower part of a sidewall of the first isolation trench;
   a first filling layer, filling a recess defined by the first insulating layer in the first isolation trench;
   a fourth insulating layer located between an inner wall of the first isolation trench and the first insulating layer, and covering the bottom surface and the lower part of the sidewall of the first isolation trench;
   a second insulating layer covering an upper part of the sidewall of the first isolation trench;
   a third insulating layer at least partially located between the first insulating layer and the second insulating layer to isolate the first insulating layer from the second insulating layer, wherein the third insulating layer comprises a bottom layer and a sidewall layer, the bottom layer covers a top of the fourth insulating layer, a top of the first insulating layer and a top of the first filling layer, and the sidewall layer is located between the upper part of the sidewall of the first isolation trench and the second insulating layer; and
   a second filling layer, filling a recess defined by the second insulating layer together with the bottom layer of the third insulating layer in the first isolation trench;
   wherein the second isolation trench comprises a first sub-trench and a second sub-trench, and a width of the second sub-trench is greater than a width of the first sub-trench;
   the fourth insulating layer covers a bottom surface and a lower part of a sidewall of the second sub-trench, and the first insulating layer fills a recess defined by the fourth insulating layer in the second sub-trench;
   the third insulating layer covers an upper part of the sidewall of the second sub-trench and the top of the fourth insulating layer and the top of the first insulating layer; and
   the second filling layer fills a recess defined by the third insulating layer in the second sub-trench.

2. The semiconductor structure of claim 1, wherein a material of the first insulating layer and a material of the second insulating layer comprise nitride, and a material of the third insulating layer comprises oxide.

3. The semiconductor structure of claim 1, wherein a ratio of a height of the first insulating layer to a height of the second insulating layer is in a range of 2 to 6, and a ratio of a height of a part of the third insulating layer located between the first insulating layer and the second insulating layer to the height of the second insulating layer is in a range of 0.3 to 0.7.

4. The semiconductor structure of claim 1, wherein both a thickness of the first insulating layer and a thickness of the second insulating layer are in a range of 5 nm to 30 nm.

5. The semiconductor structure of claim 1, wherein the first isolation trench is located in a device core region or a peripheral region for isolating selection transistors, and the second isolation trench is located in a device unit region for isolating memory units.

6. A method for manufacturing a semiconductor structure, comprising:
   providing a substrate;
   etching the substrate to form a first isolation trench and a second isolation trench, wherein the second isolation trench comprises a first sub-trench and a second sub-trench, and a width of the second sub-trench is greater than a width of the first sub-trench;

forming a first insulating layer, wherein the first insulating layer covers a bottom surface and a lower part of a sidewall of the first isolation trench;

forming a third insulating layer on the first insulating layer, wherein the third insulating layer at least covers a top of the first insulating layer; and forming a second insulating layer on the third insulating layer, wherein the second insulating layer covers an upper part of the sidewall of the first insulating trench, and is isolated from first insulating layer by the third insulating layer;

wherein before forming the first insulating layer, the method further comprises:

forming a fourth insulating material layer, wherein the fourth insulating material layer covers an inner surface of the first isolation trench and an inner surface of the second sub-trench, and fills the first sub-trench.

7. The method of claim 6, wherein the forming the first insulating layer comprises:

forming a first insulating material layer, wherein the first insulating material layer covers the fourth insulating material layer and fully fills the second sub-trench;

forming a first filling material layer, wherein the first filling material layer covers the first insulating material layer and fully fills the first isolation trench; and etching the first filling material layer, the first insulating material layer and the fourth insulating material layer to make a top of the first insulating material layer, a top of the fourth insulating material layer and a top of the first filling material layer lower than an upper surface of the substrate, so as to form the first insulating layer, the fourth insulating layer and the first filling layer.

8. The method of claim 7, wherein the forming the third insulating layer comprises:

forming and etching a third insulating material layer to form the third insulating layer covering a top of the fourth insulating layer, the top of the first insulating layer and a top of the first filling layer, and the upper part of the sidewall of the first isolation trench and the upper part of a sidewall of the second sub-trench, wherein a part of the third insulating layer in the first isolation trench defines a first accommodating cavity, and a part of the third insulating layer in the second sub-trench defines a second accommodating cavity.

9. The method of claim 8, wherein the forming the second insulating layer comprises:

forming a second insulating material layer, wherein the second insulating material layer covers a bottom surface and a sidewall of the first accommodating cavity and fully fills the second accommodating cavity; and etching the second insulating material layer to remove the second insulating material layer located in the second accommodating cavity and the second insulating material layer covering the bottom surface of the first accommodating cavity, so as to form the second insulating layer covering the sidewall of the first accommodating cavity.

10. The method of claim 9, after forming the second insulating layer, the method further comprises:

forming a second filling material layer on the third insulating layer and the second insulating layer, wherein the second filling material layer fully fills the first accommodating cavity and the second accommodating cavity; and etching the second filling material layer to make a top of the second filling material layer flush with a top of the second insulating layer, so as to form a second filling layer.

11. The semiconductor structure of claim 1, wherein a thickness of the first insulating layer is greater than a thickness of the second insulating layer.

12. The method of claim 6, wherein a thickness of the first insulating layer is greater than a thickness of the second insulating layer.

\* \* \* \* \*